(12) United States Patent
Goldstein et al.

(10) Patent No.: US 7,139,135 B2
(45) Date of Patent: Nov. 21, 2006

(54) APPARATUS FOR ADJUSTMENT OF PARTIAL COHERENCE OF LIGHT ENERGY IN AN IMAGING SYSTEM

(75) Inventors: Michael Goldstein, Ridgefield, CT (US); John M. Urata, Norwalk, CT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/460,419

(22) Filed: Jun. 11, 2003

(65) Prior Publication Data

US 2004/0008424 A1 Jan. 15, 2004

Related U.S. Application Data

(63) Continuation of application No. 09/676,594, filed on Sep. 29, 2000, now Pat. No. 6,611,387.

(51) Int. Cl.
*G02B 9/00* (2006.01)
*G02B 9/08* (2006.01)
*G03B 27/54* (2006.01)

(52) U.S. Cl. .................. 359/738; 355/67

(58) Field of Classification Search ........ 359/738–740; 355/53, 67, 71
See application file for complete search history.

(56) References Cited

U.S. PATENT DOCUMENTS

| | | | |
|---|---|---|---|
| 5,657,138 A | * | 8/1997 | Lewis et al. ............ 359/15 |
| 5,712,698 A | | 1/1998 | Poschenrieder et al. |
| 5,896,188 A | * | 4/1999 | McCullough ........... 355/67 |
| 5,946,079 A | | 8/1999 | Borodovsky |
| 6,313,957 B1 | | 11/2001 | Heemstra et al. |
| 6,466,304 B1 | | 10/2002 | Smith |
| 6,548,781 B1 | * | 4/2003 | Brunwinkel ........ 219/121.73 |

FOREIGN PATENT DOCUMENTS

| | | | |
|---|---|---|---|
| EP | 0744663 A1 | | 11/1996 |
| JP | 10206922 | * | 8/1998 |

* cited by examiner

*Primary Examiner*—Alicia M Harrington
(74) *Attorney, Agent, or Firm*—George Chen

(57) ABSTRACT

The present invention describes an apparatus comprising an optical array generating a distribution of partial coherence of light energy and an aperture to select a subset of said distribution of partial coherence.

15 Claims, 4 Drawing Sheets

APPARATUS FOR ADJUSTMENT OF PARTIAL COHERENCE OF LIGHT ENERGY IN AN IMAGING SYSTEM

This is a Continuation application of Ser. No.: 09/676,594, filed Sep. 29, 2000, now U.S. Pat. No. 6,611,387.

BACKGROUND OF THE INVENTION

1. Field of the Invention

The present invention relates to the field of semiconductor integrated circuit (IC) manufacturing, and more specifically, to an apparatus for and a method of adjusting the partial coherence of the light energy in an imaging system, such as a step-and-scan tool used in photolithography.

2. Discussion of Related Art

The performance of a microprocessor comprising transistors is primarily determined by the channel lengths of the transistors. The channel lengths are highly dependent on the widths of the gates in the transistors. Photolithography is the process by which a pattern of gates can be transferred from a reticle to a layer of photoresist on a wafer during the fabrication of a microprocessor. The reticle is a photomask which has a pattern of gates extracted from a layout of a microprocessor. Photoresist is a radiation-sensitive material. Radiation is the transfer of energy as waves or particles. The application of radiation in the form of light, electron, or ion energy to form a latent image in the photoresist is called exposure. Exposure is done in an imaging tool, such as a step-and-repeat tool or a step-and-scan tool. After exposure, a develop process selectively removes portions of the photoresist layer corresponding to the latent image. The pattern realized in the photoresist is, in turn, replicated through an etch process in the conductive material forming the gate.

The yield of microprocessors fabricated on a wafer is affected by the variability in critical dimension (CD) of the gate widths. Gate CD is influenced by a variety of factors, with some being systematic and others being random. One type of effect derives from the interaction of photolithography with wafer topography, thin film thickness, and substrate reflectivity. A second type of effect comes from non-uniformity of CD across the reticle. A third type of effect involves imprecision and inaccuracy of the imaging tool in leveling, focusing, or exposing the wafer. However, aberrations in the optics of the imaging tool have become an increasingly important determinant of gate CD variability as dimensions in the transistors shrink below 130 nanometers.

A gate layer is typically printed on a wafer with a step-and-scan type of imaging tool so as to obtain images with sufficiently high fidelity and accurate placement. A wafer is partitioned into identical small areas called fields that are appropriately aligned and sequentially exposed by stepping and scanning. Stepping refers to shifting to a predetermined location of the wafer in order to expose a desired field with the imaging tool. Scanning refers to synchronously moving a reticle and a wafer with respect to the projection optics in order to "shine" light energy through a slit and "paint" the light energy across a reticle onto a field on the wafer.

CD variability along the scan direction is inherently reduced since scanning the slit across the field has a smoothing effect. However, CD variability along the slit direction may be caused by aberrations in the optics or by non-uniform distribution of dose or partial coherence.

Dose is the amount of light energy per unit area delivered to the wafer plane. Non-uniform dose in the direction along the slit may be compensated by adjusting the slit width as a function of the slit length. The slit width may be changed by using an aperture with one fixed edge and one articulated edge.

Partial coherence is the numerical aperture (NA) of the illumination optics divided by the NA of the projection optics. The NA is a measure of the divergence angle of the light energy. NA may be varied by changing the size of an aperture stop at a pupil plane of the condenser or relay lens system.

The optical efficiency of an imaging tool may be enhanced by using a non-tool specific array at or near a conjugate plane to isotropically expand light into a region slightly larger than the desired illuminator NA. An aperture stop may be used to "clean up" the light as needed.

As gate CD on a microprocessor continually shrinks, the within-field CD variability consumes an increasingly larger portion of the overall CD error budget. The within-field CD variability encompasses isolated-dense (iso-dense) bias and horizontal-vertical (H-V) bias. Iso-dense bias refers to CD variability caused by proximity to other features. H-V bias refers to CD variability caused by aberrations in the optics or by non-uniformity in partial coherence between two orthogonal directions, in particular, the horizontal direction and the vertical direction.

FIG. 1 shows a tool-specific array 110 that minimizes H-V bias in the direction along the slit. Customization is based on the aberration signature of a particular projection optic. The ellipses represent the illuminator NA into which the tool-specific array 110 sends light energy. The tool-specific array 110 comprises optical elements 120 that maintain a constant partial coherence ellipticity in a first dimension 130 while varying partial coherence ellipticity in a second dimension 140. The first dimension 130 and the second dimension 140 are orthogonal to each other. When a step-and-scan type of imaging tool is used to pattern the gate layer in a microprocessor, the first dimension 130 corresponds to a direction along the scan while the second dimension 140 corresponds to a direction along the slit.

Unfortunately, a tool-specific array 110 incurs significant cost and requires a long time to build. Furthermore, the customization must be repeated whenever major changes are detected in the aberration signature of the imaging tool or the sensitivity of the product.

Thus, what is needed is an apparatus for and a method of adjusting the partial coherence of the light energy in an imaging system, such as a step-and-scan tool used in photolithography.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes an apparatus for and a method of adjusting the partial coherence of the light energy in an imaging system, such as a step-and-scan tool used in photolithography.

Figure 1:
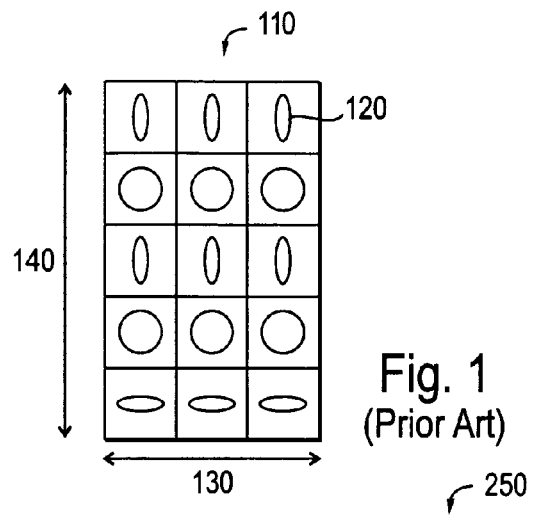
FIG. 1 is an illustration of a plane view of an array of optical elements in the prior art.
Figure 2A:
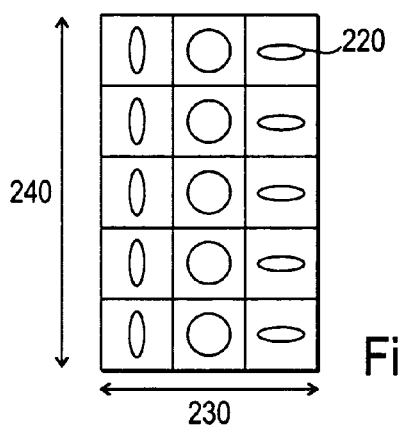
FIG. 2(a) is an illustration of a plane view of an array of optical elements according to the present invention.
Figure 2B:
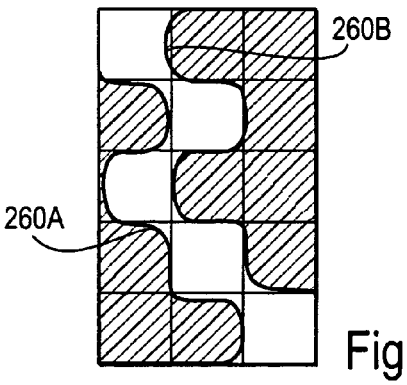
FIG. 2(b) is an illustration of a plane view of an adjustable aperture with articulated edges according to the present invention.

In a first embodiment of the present invention, horizontal-vertical (H-V) bias along the direction of a slit is reduced by using an array 210, as shown in FIG. 2(a), in conjunction with an aperture 250 with articulated edges 260A and 260B, as shown in FIG. 2(b). H-V bias refers to CD variability between two orthogonal directions, in particular, the horizontal direction and the vertical direction. H-V bias varies as a function of pitch. Pitch is the periodicity in a pattern of regularly-repeating features. H-V bias may be caused by aberrations in the projection optics or non-uniformity in partial coherence of the illumination. One kind of optical aberration is astigmatism, which causes H-V bias that is very sensitive to focus. Another kind of optical aberration is coma, which causes H-V bias that is not appreciably sensitive to focus.

The array 210 is substantially planar with a first dimension 230 and a second dimension 240 that are orthogonal to each other. When a step-and-scan type of imaging tool is used, the first dimension 230 corresponds to a direction along a scan while the second dimension 240 corresponds to a direction along a slit. The slit is often rectangular, generally being smaller in the first dimension 230 than in the second dimension 240. However, the slit may be square, or, if desired, arcuate in shape.

The array 210 may vary partial coherence continuously (not shown) without comprising discrete elements. An example would be a diffraction grating that is not periodic.

Alternatively, the array 210 may comprise discrete elements 220, as shown in FIG. 2(a). The optical elements 220 may be primarily refractive or primarily diffractive to modify the partial coherence of the light. Lenslets may be used for the optical elements 220 if desired.

The spacing of the optical elements 220 may be periodic in the first dimension 230 or the second dimension 240 or both dimensions. The array 210 need not be homogeneous or isotropic. For example, circular illumination, also known as "top hat" illumination, may be produced using optical elements 220 in an array 210 to generate partial coherence ellipticity that would vary along a first dimension 230 while remaining constant in a second dimension 240.

Figure 2C:
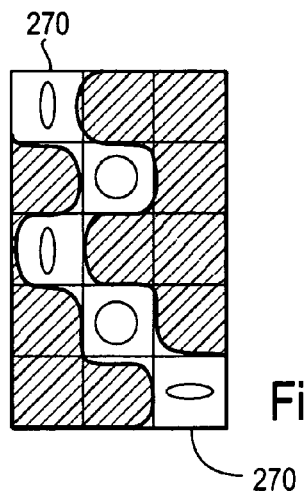
FIG. 2(c) is an illustration of a plane view of an array that is selectively obscured or occluded by an adjustable aperture according to the present invention.

An aperture 250 with articulated edges 260A and 260B is used to selectively obscure or occlude some of the optical elements 220 in the array 210, as shown in FIG. 2(b). The result is a subset 270 of the array 210 with a desired distribution of partial coherence ellipticity along the direction of the slit, as shown in FIG. 2(c), which will compensate for the local H-V bias.

The number of optical elements 220 obscured or occluded in the array 210 by the aperture 250 should be minimized so as to maximize radiometric efficiency across the slit. Consequently, it may be desirable that most of the optical elements 220 in an array 210 do not alter partial coherence ellipticity while only a few do alter partial coherence ellipticity.

Figure 2D:
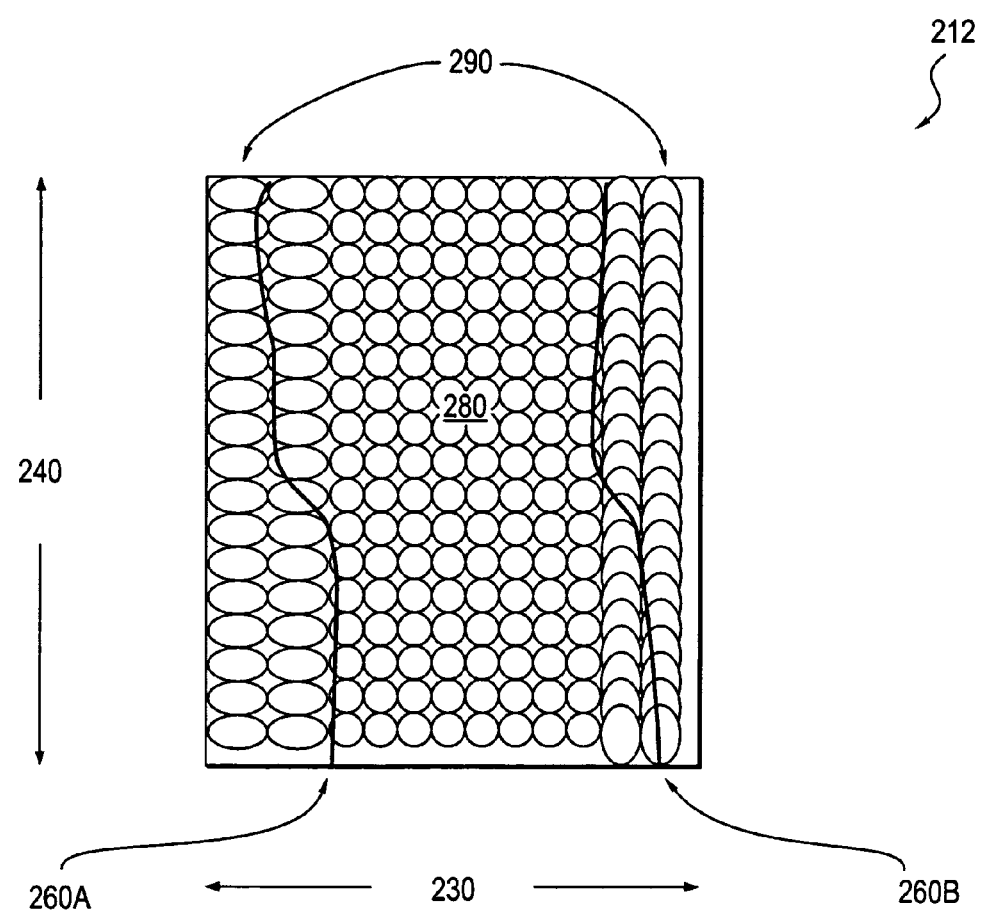
FIG. 2(d) is an illustration of a plane view of an array that maximizes optical efficiency according to the present invention.
Figure 2E:
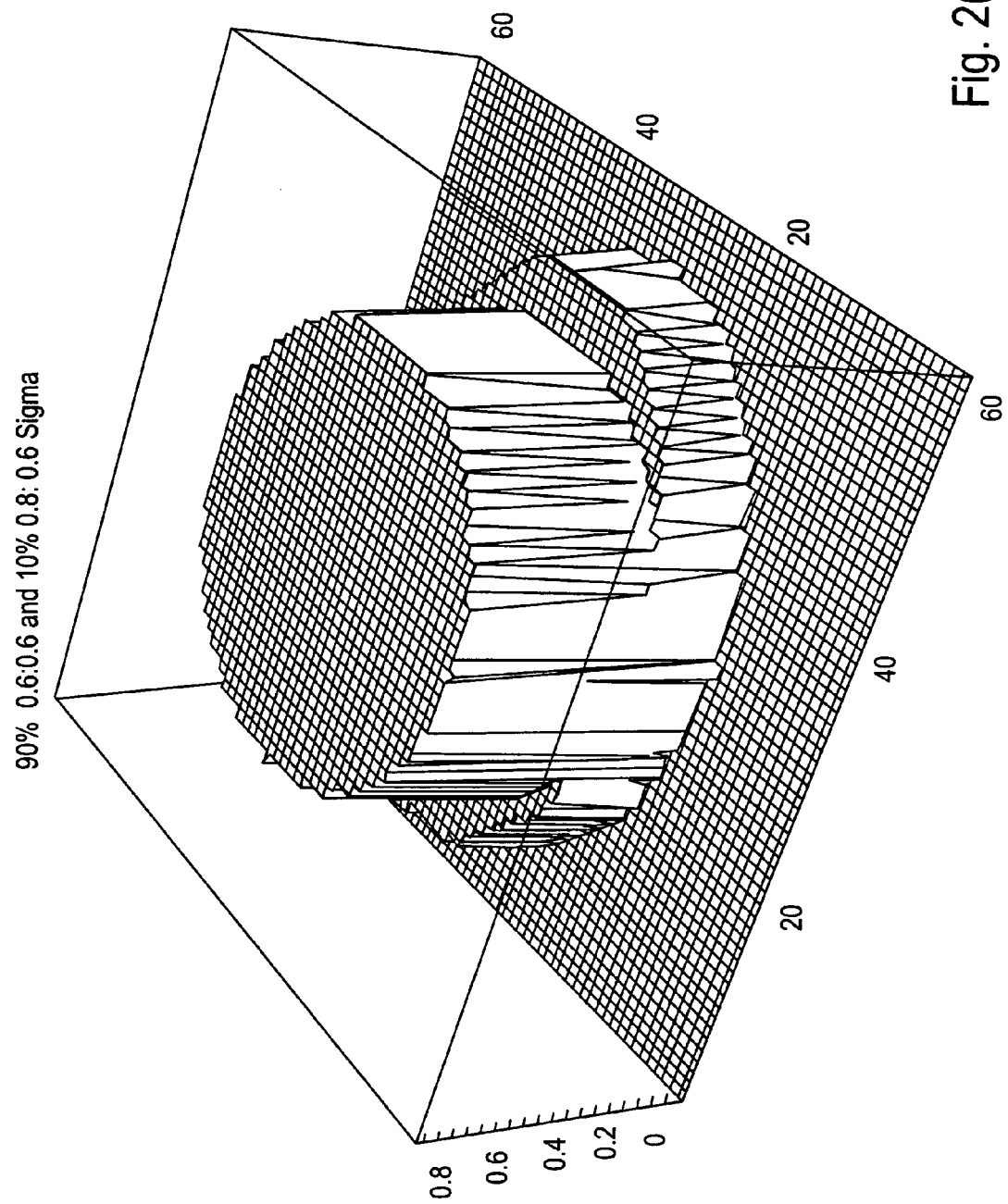
FIG. 2(e) is an illustration of scan-integrated illumination according to the present invention.

As an example, FIG. 2(d) depicts a case where a majority 280 of optical elements towards the center of an array 212 generates circular illumination while a minority 290 of optical elements towards both ends of the array 212 generates elliptical illumination. An aperture with articulated edges 260A and 260B may then be used to selectively obscure or occlude optical elements so as to produce a scan-integrated illumination, as shown in FIG. 2(e).

As needed, the separation between articulated edges 260A and 260B may be varied to adjust dose as a function of direction 240 along the slit. After being integrated at each height due to scanning in the direction 230, the illumination due to the unoccluded subset of the array will reduce H-V bias. Other lithographic effects caused by optical aberrations, such as asymmetry in contact holes, may be similarly corrected.

The above description of the invention assumes the use of nominally "top hat" illumination. While top hat illumination is typically used in photolithography, other forms of illumination may be used as well. For example, off-axis illumination (OAI), also known as modified illumination, may be used to improve resolution of features or depth of focus. Examples of OAI include annular illumination and quadrupole illumination. The present invention of using an array 210 with variable partial coherence along the scan direction 230 of a slit in conjunction with an aperture 250 with articulated edges 260A and 260B would still be applicable.

Generally, the major axis of the elliptical NA due to optical elements 220 may be changed in both a first dimension 230 and a second dimension 240. However, in some cases, particularly for non-top hat illumination, an array may be designed to vary the illuminator NA in only one direction. The illuminator NA in the orthogonal direction could then be controlled by an aperture in the pupil plane of the illuminator or condenser. An array that only varies the illuminator NA in one direction would be easier to fabricate than an array that varies the illuminator NA in two orthogonal directions.

Figure 3:
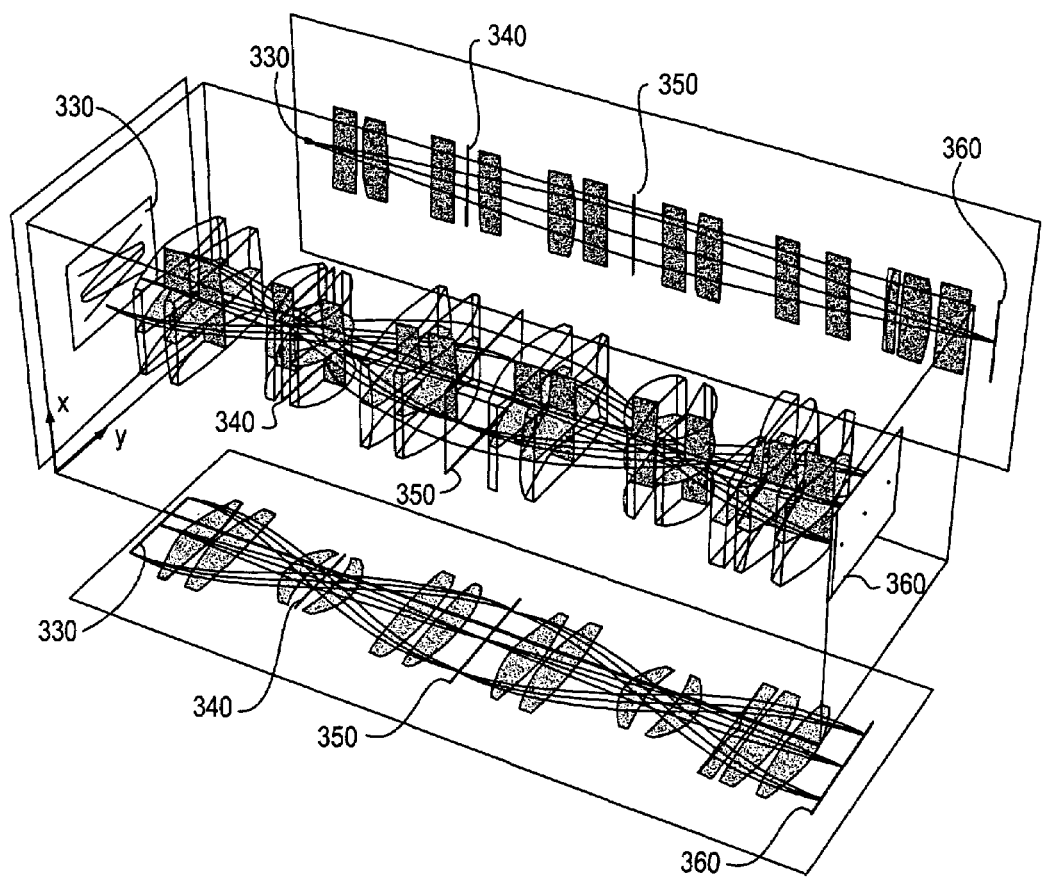
FIG. 3 is an illustration of cross-sectional views of a relay lens in two orientations according to the present invention.
Figure 3:
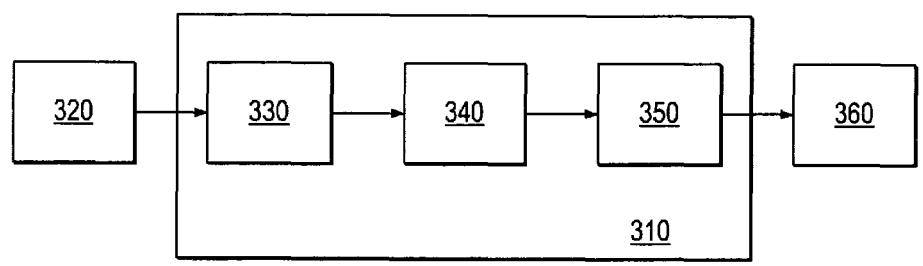

In a second embodiment of the present invention, as shown in FIG. 3, a relay lens 310 is used to adjust partial coherence ellipticity across a field for the case of top hat illumination. A condenser 320 provides light energy input to the relay lens 310 by focusing Kohler illumination onto a first adjustable aperture 330. The light energy from the illuminator has a nominal partial coherence. The condenser 320 may be a microlens array, a fly's eye lens, a rod lens, or some other kind of optics.

The first adjustable aperture 330 defines field size. The first adjustable aperture 330 has articulated edges to locally adjust intensity or dose of the light energy as a function of Y or position along the slit. The adjustment may be made dynamically by software.

The relay lens 310 has a second adjustable aperture 340 at a Y-pupil plane. The second adjustable aperture 340 has edges that may be positioned to globally adjust the partial coherence in the Y-direction. The edges of the second adjustable aperture 340 may be articulated if desired. The adjustment may be made dynamically by software.

The relay lens 310 has a third adjustable aperture 350 at an X-pupil plane that is also a Y-conjugate plane. The third adjustable aperture 350 has articulated edges to selectively obscure or occlude portions of the plane to locally adjust the partial coherence in the X-direction as a function of Y or position along the slit. The adjustment may be made dynamically by software. The third adjustable aperture 350 must be symmetric about the optical axis so as not to affect the telecentricity of the system. In a telecentric system, magnification would not be affected by errors in focus.

FIG. 3 shows the second adjustable aperture 340 as being upstream of the third adjustable aperture 350. Upstream means being located in a position in the light path that is nearer the illumination source and further from the wafer plane. If desired, the third adjustable aperture 350 may be upstream of the second adjustable aperture 340.

The relay lens 310 provides light energy output to the reticle 360 by focusing Kohler illumination with the desired partial coherence ellipticity as a function of position along the slit. The pupil fill in the second embodiment has an elliptical contour with a flat top so that the radiometric efficiency can be maximized with minimal correction.

In a third embodiment of the present invention, aberrations in an optical system are compensated by adjusting partial coherence in different directions at different pupil planes. For example, partial coherence may be adjusted in a first direction at a first pupil plane. Then partial coherence may be adjusted in a second direction at a second pupil plane. The second pupil plane is a conjugate of the image plane of the first direction.

The second direction may be orthogonal to the first direction. At each pupil plane, the partial coherence may be controlled globally or locally. Global control means that the adjustment of partial coherence is independent of position within the pupil plane. Local control means that the adjustment of partial coherence is a function of position within the pupil plane.

Controlling partial coherence in different directions at different pupil planes can maximize radiometric efficiency. In a photolithography process, controlling partial coherence in different directions at different pupil planes can also minimize H-V bias that is caused by optical aberrations.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an apparatus for and a method of adjusting the partial coherence of the light energy in an imaging system, such as a step-and-scan tool used in photolithography.

We claim:

1. An apparatus comprising:
   an array of optical elements to generate a distribution of partial coherence of light energy, said array being planar; and
   a first aperture to select a subset of said optical elements, said first aperture comprising articulated edges to change shape and size of said first aperture wherein a separation between said articulated edges may be varied to adjust dose.

2. The apparatus of claim 1 wherein said distribution varies continuously within said array.

3. The apparatus of claim 1 wherein said array comprises a diffractive grating that is not periodic.

4. The apparatus of claim 1 wherein said array further comprises optical elements that generate elliptical illumination.

5. The apparatus of claim 4 wherein said optical elements are primarily refractive.

6. The apparatus of claim 5 wherein said optical elements comprise lenslets.

7. The apparatus of claim 4 wherein said optical elements are primarily diffractive.

8. The apparatus of claim 1 wherein said first aperture has said articulated edges to selectively obscure or occlude some of said optical elements.

9. The apparatus of claim 1 wherein said array is periodic in a first direction and a second dimension.

10. The apparatus of claim 1 wherein said array has a first dimension and a second dimension, said first dimension and said second dimension being orthogonal to each other.

11. The apparatus of claim 10 wherein said first dimension corresponds to a direction along the scan while said second dimension corresponds to a direction along the slit in a step-and-scan type of imaging tool.

12. The apparatus of claim 11 wherein said partial coherence varies in said first dimension of said array, but remains constant in said second dimension of said array.

13. The apparatus of claim 1 wherein said subset compensates for optical aberrations or nonuniformity in the partial coherence in the illumination.

14. The apparatus of claim 1 wherein said subset changes horizontal-vertical bias (H-V bias).

15. The apparatus of claim 1 further comprising a second aperture to change cross-sectional area to adjust dose.

* * * * *